United States Patent
Gruhle et al.

(10) Patent No.: US 7,079,039 B2
(45) Date of Patent: Jul. 18, 2006

(54) PROCESS AND DEVICE FOR TESTING ELECTRIC MOTORS, IN PARTICULAR FAN MOTORS, FOR FUNCTIONALITY

(75) Inventors: Andreas Gruhle, Ulm (DE); Horst Kibbel, Erbach (DE)

(73) Assignee: DaimlerChrysler AG, Stuttgart (DE)

( * ) Notice: Subject to any disclaimer, the term of this patent is extended or adjusted under 35 U.S.C. 154(b) by 10 days.

(21) Appl. No.: 10/736,469

(22) Filed: Dec. 15, 2003

(65) Prior Publication Data
US 2004/0124844 A1    Jul. 1, 2004

(30) Foreign Application Priority Data
Dec. 13, 2002  (DE) ................ 102 58 665
Jan. 3, 2003   (DE) ................ 103 00 051

(51) Int. Cl.
*G08B 21/00*    (2006.01)
(52) U.S. Cl. .................. 340/648; 361/687; 361/688
(58) Field of Classification Search ................ 340/648; 361/687, 688
See application file for complete search history.

(56) References Cited

U.S. PATENT DOCUMENTS

| | | | | |
|---|---|---|---|---|
| 4,506,218 A | * | 3/1985 | Brown et al. ............. 324/772 |
| 4,949,022 A | * | 8/1990 | Lipman ................... 318/254 |
| 5,363,024 A | * | 11/1994 | Hiratsuka et al. ......... 318/254 |
| 5,500,585 A | * | 3/1996 | Aab ..................... 324/165 |
| 5,523,701 A | * | 6/1996 | Smith et al. ............. 324/772 |
| 5,596,271 A | * | 1/1997 | Lowery .................. 324/174 |
| 5,739,698 A | | 4/1998 | Bowers et al. |
| 6,009,362 A | * | 12/1999 | Furukawa ................. 701/29 |
| 6,144,924 A | * | 11/2000 | Dowling et al. ............ 702/60 |

FOREIGN PATENT DOCUMENTS

DE    693 27 066 T2   6/2000
EP    0 552 991 B1    11/1999

OTHER PUBLICATIONS

Nienhuis, R. & Siegel J.M. "Analysis of Head Movement and Position Using Hall Effect Devices" 1989, Pergamon Press plc, Physiology & Behavior, vol. 45 pp. 199-203.*

* cited by examiner

*Primary Examiner*—Thomas J. Mullen, Jr.
*Assistant Examiner*—Samuel J. Walk
(74) *Attorney, Agent, or Firm*—Akerman Senterfitt; Stephan A. Pendorf

(57) ABSTRACT

The invention concerns a device for and a process for testing electric motors, in particular fan motors, for functionality, wherein electromagnetic alternating fields produced by an electric motor are received by an antenna, wherein the received signals are analyzed for signal components in the frequency range of the rotation value of electric motors or their harmonics via an analysis unit, and wherein upon determination of functionality the results are indicated by an indicator unit.

17 Claims, 1 Drawing Sheet

PROCESS AND DEVICE FOR TESTING ELECTRIC MOTORS, IN PARTICULAR FAN MOTORS, FOR FUNCTIONALITY

BACKGROUND OF THE INVENTION

1. Field of the Invention

The invention concerns a device and a process for testing electric motors, in particular fan motors, for functionality.

2. Description of the Related Art

A large number of electrical devices, in particular electronic devices, are equipped with electric motors for cooling of individual components, generally referred to as fan motors. If such an electric motor, in particular a fan motor, fails or is not fully functional for other reasons, this generally results in ruination of essential components by overheating, and therewith to damage of the device. When installing the electric motor, it is possible that the motor is damaged such that the motor becomes non-functional. Thus it is of particular significance to check or test the functionality of an electric motor, in particular a fan motor, in the installed condition, in particular within a housing, that is, in a non-accessible condition.

It is known to test the functionality of an electric motor in operation by direct visional inspection, for example by checking whether it rotates or whether it produces an air flow. Besides this, a diagnosing device is disclosed in DE 32 33 018 A1, to which separate electromotor devices can be connected and tested for functionality. For this, the current draw and in certain cases the temperature of the device are used for testing and evaluating the functionality of the entire device. This diagnostic device has proven itself not to be very suitable for testing installed individual electric motors, in particular fan motors.

SUMMARY OF THE INVENTION

The present invention is concerned with the task of providing a device and a process for testing electric motors, in particular fan motors, for functionality, which are economical to employ and which make possible a selective indication regarding the functionality of installed electric motors, in particular fan motors, in an electrical device or another unit provided within a housing.

This task is solved by a device with the characteristics of patent claim 1 and a process with the characteristics of patent claim 14.

Advantageous further developments of the invention are set forth in the dependent claims.

The invention takes advantage of the fact that a functional electric motor in operation, due to its mode of operation according to the principle of an electric motor, involves rotating magnets, electromagnets or coils, which produce rotating magnetic or electrical fields and therewith alternating fields. These alternating fields exhibit a spectral distribution which is particularly characteristic in the range of the rotating value, that is, the rotation frequency, of the electric motor or the field generating components. Besides this, frequencies may also be produced in the range of multiples of the rotation value, the so-called harmonics.

The invention utilizes the produced electrical or, as the case may be, magnetic alternating field, also referred to as electromagnetic alternating field, to the extent that it is detected, analyzed and identified as an alternating field of an electric motor, in particular a fan motor. By this mode of identification it can be determined whether an interruption exists in the input line of the electrical supply line for the electrical energy supply or in the internals of the electric motor or, as the case may be, whether there is an interruption of the electrical connection within the motor or a mechanical blockage of rotation so that the functionality of the electric motor is absent. If functionality is present, then by means of the inventive device or as the case may be according to the inventive process the produced alternating current is detected and identified as an alternating current produced by the electric motor, and a corresponding signal is provided to the user of the device. The invention makes possible a testing of electric motors, in particular fan motors, without direct contact, that is, while in the installed condition, even when a housing prevents viewing of the motor or a direct connection of contacts. Besides this, the inventive testing for functionality has been found to be very rapid and very meaningful, that is, able to provide a wealth of information.

It has been found to be particularly advantageous that the electromagnetic alternating fields produced by the electric motors, in particular fan motors, exhibit in operation a very strong distance dependency, so that a selective evaluation of the functionality of individual electric motors, in particular fan motors, in a housing or behind a cover, in particular of a vehicle, is possible in simple manner.

The invention further takes advantage thereof, that within the framework of the analysis of the received electromagnetic alternating currents, a checking is carried out as to the extent that signal components exist or do not exist in the frequency range of the rotation value of electric motors or their harmonics. By this limited consideration of the electromagnetic frequency range of the received signals a reliable classification and reliable evaluation and judging of the signal is provided, so that a meaningful assessment or evaluation of the functionality of electric motors, in particular fan motors, is made possible—even in the installed condition without possibilities of direct access.

In accordance with the invention it is not the presence of mechanical or optical characteristics which forms the basis for the testing or verification of the evaluation of the functionality of electric motors, in particular fan motors, but rather the direct emission signature of a rotating functional electric motor or fan motor, namely, that by operating according to the principle of an electric motor electromagnetic alternating fields are produced, which allow the tester to conclude that a rotation of components of the motor is taking place, and thus conclude that the motor is functional. In accordance therewith a sensor is not integrated in the input line of the electric motor for detecting the presence of a supplied electrical control or energy supply signal, but rather it is the magnetic alternating fields which are produced upon electrical-mechanical transformation which are used for evaluation of the functionality of the electric motors, in particular fan motors. Consequently a very effective, economical and meaningful process and a corresponding device for evaluation and monitoring functionality of electric motors, in particular fan motors, in particular in the installed condition, is provided. It is precisely the possibility of monitoring or checking the functionality of electric motors, in particular fan motors, in the installed condition, which is of particular significance, since the dismantling or removal of electric motors, in particular fan motors, in a closely confined space, as exists behind upholstery of a vehicle passenger compartment, is very difficult and expensive. As result of the present invention this is no longer necessary.

According to a preferred embodiment of the inventive device an antenna for reception of the magnetic alternating fields is provided, which includes one or more reception coils, which are preferably oriented in different spatial directions. Thereby there is made possible on the one hand, in particular by the selection of various receiver coils, to have differentiated information regarding the type and manner of the alternating fields, in particular with respect to their strength and their frequency, but also with regard to the varying orientations of the magnetic alternating fields. By the employment of at least three receiver coils in varying spatial orientations differing from each other, it is besides this made possible that always a significant proportion of the received magnetic alternating fields are detected by the antenna and supplied for analysis to a unit for analysis of the received signals. Thereby a very reliable functioning of the inventive device is provided.

Besides this it has been found useful to provide, between the antenna and the unit for analysis, an amplifier for amplifying the received signals. With the aid of this amplifier it is ensured that a sufficiently strong signal is made available for analysis. Preferably a low noise amplifier is employed, which is low in noise particularly in the range of the typical rotation value of the electric motor or, as the case may be, the harmonics thereof. The amplifier guarantees a particularly simple evaluation or, as the case may be, analysis of the received signals, which substantially simplifies the circuitry for analysis of the received signals. Consequently, the present invention provides a very simple and cost effective device for the testing of electric motors, in particular fan motors.

It has been found particularly useful to provide in the unit for analysis a filter unit for filtering the received signals. This filter unit is preferably a bandpass filter, with a bandpass width corresponding to the typical frequency range of the rotation value of electric motors or their harmonics. Thereby it is in significant measure accomplished that non-relevant, interfering received electromagnetic alternating fields do not disturb the analysis of the received signals. Thereby a reliable evaluation of the received signals is accomplished in significant measure with respect to the functionality of the electric motor to be tested.

It has been found to be particularly useful to provide the filter unit with multiple switchable bandpass filters, with bandpass widths corresponding to the frequency ranges of the rotation values of various electric motors or, as the case may be, their harmonics, so that with the aid of a simple switching of the bandpass filter respectively an optimized analysis of the received signals is made possible. This has demonstrated itself to be particular useful in the testing of functionality of equipment comprised of multiple, in particular differing, electric motors, which are spaced closely to each other. A reliable meaningful information capture is made possible by the inventive device.

Therein it has been found particularly useful to provide a filter with a bandpass width of approximately 100 Hz through 10 kHz or, as the case may be, of 100 Hz to 1 kHz or as the case may be from 1 Hz to 1 kHz, since this bandpass width is particularly relevant for many fan motors or other electric motors, since their rotational speed and the therefrom resulting alternating fields have frequency components precisely relevant herein. Thereby it is ensured that a unit for analysis with a single filter with the above-mentioned bandpass width routinely makes possible a meaningful evaluation. This device is particularly simple and economical to produce.

It has been found particularly useful to supply the received signals to a logarithmic stage or step, such that the analysis of the received signals can be carried out more meaningfully and more differentiated with respect to the strength of the received signals. For this, the received signal is preferably submitted to a semi-conductor component, in particular a diode with a logarithmic characteristic line.

It has been found particularly useful to provide the device with a display unit which is capable of producing an optical and/or acoustic signal upon, a positive evaluation of the functionality of the electric motor or, as the case may be, the fan motor. Therein it has been found to be particularly useful to output both an acoustic as well as an optical signal, precisely since the device is employed in a noisy space, in particular in the environment of the assembly of a vehicle which is associated with high noise levels, so that here the acoustic signal is not assuredly detected, in contrast to which in awkward positions, for example in the foot space, in which various electronic components, such as for example a navigation computer with fan motor are particularly preferably located behind upholstery, an optical signal is not easily detected, whereby here the acoustic signal is easier to perceive. This results in a very reliable informing of the user regarding the functionality of the electric motor being tested.

Besides this, it has been found to be very advantageous to construct the device as a portable device with a portable housing. All components of the inventive device, in particular inclusive of the antennas, are integrated in the portable housing or, as the case may be, secured thereto. The housing is preferably in a form which is provided with projections and troughs, which make possible a comfortable and reliable hand gripping and holding of the device with housing.

Besides this it has been found particularly advantageous to provide the device, in particular the portable device, with an independent energy supply, in particular a battery or a fuel cell system, for supplying energy.

Thereby a simple handling or operation of the device is made possible to the extent that no elaborate cabling is needed for supplying energy to the device. Therewith, a flexible employment of the inventive device in varying environments, in particular in the varying areas of the vehicle internal space, is made possible in simple manner. An impeding of the user by unnecessary cabling can thereby be avoided. Thereby a simple to operate, light, carryable device for testing of electric motors, in particular fan motors, for functionality is accomplished.

According to an alternative embodiment of the inventive device the signal received by the antenna is subjected to an analog/digital converter and subsequently supplied to a digital signal processing. This digital signal processing makes possible the analysis of the digitally transformed, received signal for signal components in the frequency range of the rotation value of electric motors or as the case may be their harmonics and makes possible the subsequent evaluation of the signal such that a reliable and meaningful information regarding the functionality of the electric motor or, as the case may be, fan motor, can be obtained. This inventive device is characterized by a very compact and economical design or construction, in particular when the digital signal processor, in certain cases in connection with the analog/digital converter, is a microcontroller, signal processor or ASIC. The digital processing makes it possible beyond this to adapt the variables of the signal analysis, in particular the frequency ranges, the threshold values, etc. very flexibly to the ambient conditions or new motor types.

A different embodiment of the invention concerns a device for testing electric motors, in particular fan motors, for functionality in which electromagnetic alternating fields are received via an antenna and thereupon analyzed as to whether these alternating fields are or are not produced by an operating electric motor. Therein the signals received by the antenna are analyzed by means of a unit for analysis to the extent as to whether or not the received signals exhibit signal components in the frequency range of the rotating values of electric motors or, as the case may be, their harmonics. If these signal components are present in the frequency range of the rotation value of electric motors or, as the case may be, their harmonics, and exhibit a sufficiently strong signal, then the functionality of the electric motor, in particular a fan motor, may be concluded therefrom, and this may be indicated by means of an optical and/or acoustic display unit.

BRIEF DESCRIPTION OF THE DRAWING

In the following the invention will be described in greater detail on the basis of an exemplary design of an inventive device.

DETAILED DESCRIPTION OF THE INVENTION

Figure 1:
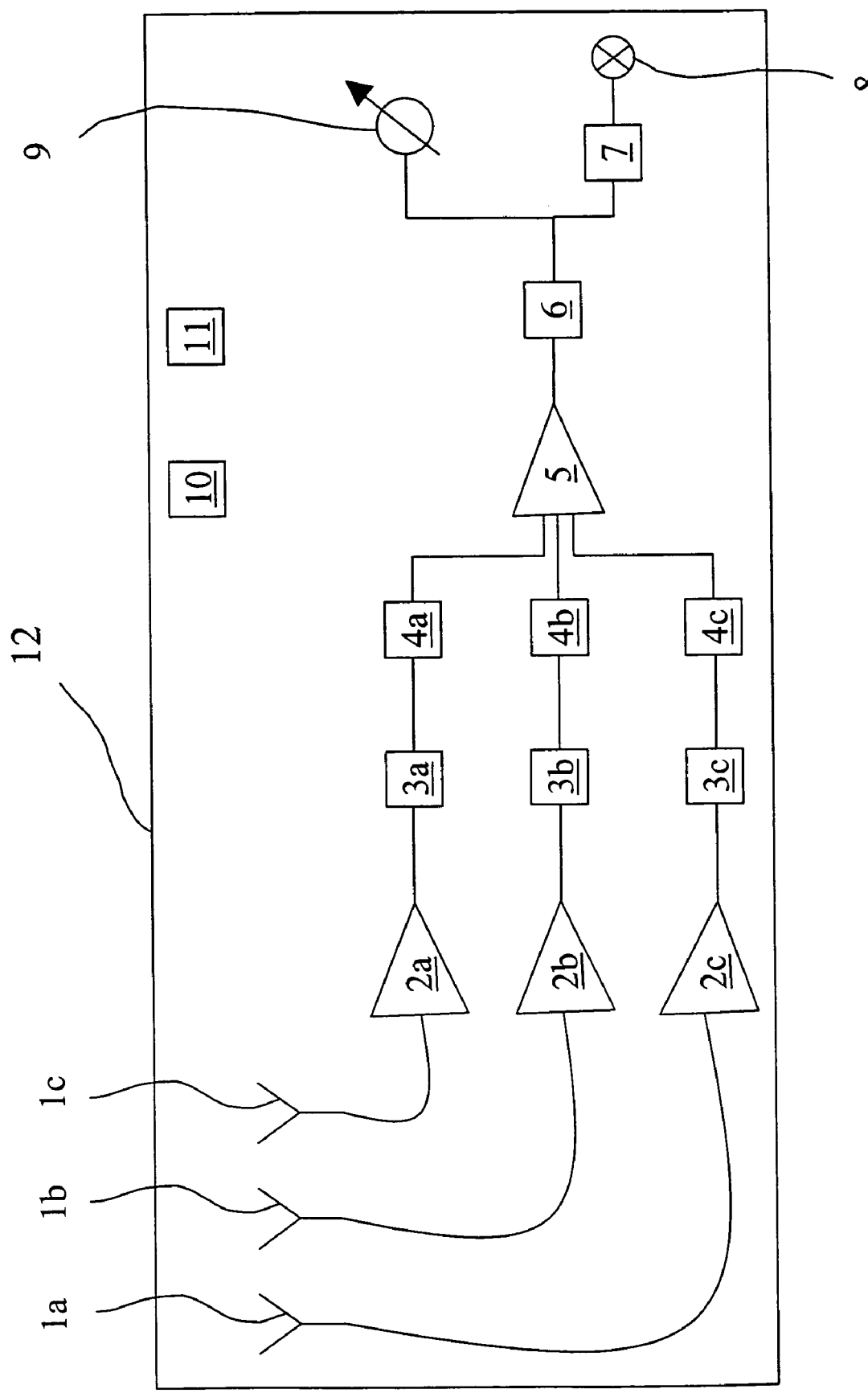
FIG. 1 shows an exemplary design of an inventive device.

The device includes three antennas 1a, 1b, 1c, which are oriented in three different spatial directions. The antennas 1a, 1b, 1c are integrated in the housing 12 of the device. The magnetic alternating fields are received via the antennas and are supplied as alternating current signals to three amplifier stages 2a, 2b, 2c. These amplify the received signals and provide them subsequently to filter stages 3a, 3b, 3c, which are bandpass filters with a bandpass width of 100 Hz to 10 kHz. This bandpass width is selected such that it includes the conventional frequency range corresponding at least partially to the conventional prevalent frequency range of the rotation values of electric motors. In the selection of the bandpass width the harmonics of the rotation values of the electric motors are also taken into consideration. Thereby it is assured that a meaningful evaluation of the functionality of the electric motor can be routinely accomplished.

The received, amplified and filtered signals are subsequently rectified via a rectifier stage 4a, 4b, 4c and summed in 5. The signal, logarithmic deformed and rectified by diode circuit 6, is submitted to a comparator 7. The comparator 7 compares the integrated signal with a predetermined threshold value. If the threshold is exceeded, then the display unit 8, which includes a beeper and a light emitting diode as acoustic and optical signals sources, is activated. If the threshold is not exceeded, then no activation and therewith no positive signal generation by means of the display unit 8 occurs. Therewith it is ascertained whether sufficiently strong electromagnetic alternating fields are present or not in the rotation frequency range of the electric motor, or in the frequency range of the rotation value of the one or more electric motors, or as the case may be their harmonics. If sufficient strengths exists, this becomes the basis for a positive evaluation of the functionality of the electric motor, in particular the fan motor. Supplementally, for more precise quantitative measurements, an analog value can be read using a display 9 (analog or digital display).

Besides the above-mentioned components there is further included in the housing 12 of the device a control unit 10, which controls the operation of the other components of the device, in particular the presetting of the threshold value of the comparator 7, as well as turning on and off. Besides this, an independent energy supply 11 is provided as energy source for the device, which can be a fuel cell system with a hydrogen gas fuel source. This independent energy supply 11 makes possible that the inventive device with the housing 12 can be brought as a mobile, flexible and portable device to any location of an electric motor, in particular fan motor, without the interference or nuisance of having to supply energy by cables.

By this particular type of the analysis and evaluation of the electromagnetic alternating fields for detection of functionality of electric motors, in particular fan motors, a very meaningful information source is provided, which even under difficult conditions provides a reliable, rapid and economic evaluation of the functionality of electric motors, in particular fan motors. A requirement to remove the electric motor, in particular fan motor, for testing is not necessary due to the inventive device. The test can be carried out very rapidly and very meaningfully.

The invention claimed is:

1. A device for testing electric motors for functionality, said device including:
   an antenna for receiving electromagnetic alternating fields generated by the operation of said electric motor;
   an amplifier for amplification of the received signal,
   an analog-digital converter for converting the received signal into a digital signal,
   a unit for analysis of the received signals for signal components in the frequency range of the rotation value of electric motors or their harmonics, said unit for analysis being a device for digital signal processing and including a bandpass filter unit with a bandpass width corresponding at least partially to the conventional prevalent frequency range of the rotation values of electric motors or the harmonics thereof, and
   an indicator unit for signaling functionality.

2. A device as in claim 1, wherein said electric motor is a fan motor.

3. The device according to claim 1, wherein the filter unit includes multiple switchable bandpass filters with bandpass widths corresponding to the frequency ranges of the rotation values of varying electric motors or their harmonics.

4. The device according to claim 1, wherein the indicator unit emits an acoustic signal.

5. The device according to claim 1, wherein said device includes a portable housing.

6. The device according to claim 1, wherein said device includes an independent energy source.

7. The device according to claim 6, wherein said independent energy source is a battery or a fuel cell system.

8. The device according to claim 1, wherein the device for digital signal processing is a microcontroller, a signal processor or an ASIC.

9. A device for testing electric motors for functionality, said device including:
   an antenna for receiving electromagnetic alternating fields generated by the operation of said electric motor;
   a unit for analysis of the received signals for signal components in the frequency range of the rotation value of electric motors or their harmonics, said unit including a bandpass filter unit with a bandpass width corresponding at least partially to the conventional prevalent frequency range of the rotation values of electric motors or the harmonics thereof and an analog/digital converter subsequent to the antenna and wherein the unit for analysis of the received signal is a device for digital signal processing;
   an amplifier for amplification of the received signal between the antenna and the unit for analysis; and,
   an indicator unit for signaling functionality, wherein the antenna includes one or more receiver coils.

10. The device according to claim 9, wherein the receiver coils are oriented in differing spatial directions.

11. A device according to claim 9, wherein
the filter unit includes a filter with a bandpass width of approximately from 1 Hz to 1 kHz.

12. A device for testing electric motors for functionality, said device including:
an antenna for receiving electromagnetic alternating fields generated by the operation of said electric motor;
a unit for analysis of the received signals for signal components in the frequency range of the rotation value of electric motors or their harmonics, said unit including a bandpass filter unit with a bandpass width corresponding at least partially to the conventional prevalent frequency range of the rotation values of electric motors or the harmonics thereof and an analog/digital converter subsequent to the antenna and wherein the unit for analysis of the received signal is a device for digital signal processing;
an amplifier for amplification of the received signal between the antenna and the unit for analysis; and
an indicator unit for signaling functionality,
wherein the bandpass filter includes a filter with a bandpass width of approximately from 100 Hz to 1 kHz.

13. A device according to claim 12, wherein
the filter unit includes a filter with a bandpass width of approximately from 100 Hz to 10 kHz.

14. A process for testing an electric motor, comprising:
placing an antenna which receives alternating electromagnetic fields in the vicinity of an electric motor which in operation generates alternating electromagnetic fields,
analyzing via an analysis unit the received signal for signal components in the frequency range of the rotation value of the electric motor or their harmonics, and
in the case that the analysis for functionality is positive, indicating this result via an indicator unit.

15. The process as in claim 14, wherein said electric motor is a fan motor.

16. A process as in claim 15, wherein said analyzing comprises
pre-determining the characteristics of the direct emission signature of a rotating functional electric motor to be tested,
detecting the alternating electromagnetic fields in the vicinity of a motor to be tested, and
comparing said detected signal with said predetermined signal.

17. A process as in claim 15, wherein said electric motor is installed in a vehicle, wherein said vehicle has at least first and second electric motors, and wherein subsequent to analysis of said first electric motor said antenna is moved to the vicinity of said second electric motor and said process is repeated.

* * * * *